United States Patent
Merdan et al.

(10) Patent No.: US 6,440,503 B1
(45) Date of Patent: Aug. 27, 2002

(54) LASER DEPOSITION OF ELEMENTS ONTO MEDICAL DEVICES

(75) Inventors: Kenneth M. Merdan, Greenfield; Vitaliy N. Shapovalov, New Hope, both of MN (US)

(73) Assignee: Scimed Life Systems, Inc., Maple Grove, MN (US)

( * ) Notice: Subject to any disclaimer, the term of this patent is extended or adjusted under 35 U.S.C. 154(b) by 0 days.

(21) Appl. No.: 09/513,547

(22) Filed: Feb. 25, 2000

(51) Int. Cl.$^7$ .................. C23C 14/02; C23C 14/28; C23C 14/32; B23K 26/08

(52) U.S. Cl. ............... 427/561; 427/596; 427/597; 219/121.78; 219/121.81; 219/121.82

(58) Field of Search .................. 427/596, 597, 427/561; 219/121.78, 121.81, 121.82

(56) References Cited

U.S. PATENT DOCUMENTS

| | | | |
|---|---|---|---|
| 4,190,759 A | * 2/1980 | Hongo et al. | 219/121 |
| 4,752,455 A | * 6/1988 | Mayer | 427/597 |
| 4,895,735 A | * 1/1990 | Cook | 427/597 |
| 4,970,196 A | 11/1990 | Kim et al. | 505/1 |
| 4,987,006 A | 1/1991 | Williams et al. | 427/53.1 |
| 5,065,697 A | * 11/1991 | Yoshida et al. | 427/597 |
| 5,281,575 A | 1/1994 | Hase et al. | 505/1 |
| 5,492,861 A | 2/1996 | Opower | 437/173 |
| 5,567,336 A | * 10/1996 | Tatah | 427/597 |
| 5,683,601 A | 11/1997 | Tatah | 219/121.85 |
| 5,725,914 A | 3/1998 | Opower | 427/592 |
| 5,760,362 A | 6/1998 | Eloy | 219/121.6 |
| 6,025,110 A | * 2/2000 | Nowak | 427/596 |
| 6,121,991 A | * 9/2000 | Paz-Pujalt et al. | 347/172 |

FOREIGN PATENT DOCUMENTS

| | | | |
|---|---|---|---|
| JP | 406172979 | * 6/1994 | 427/586 |

OTHER PUBLICATIONS

R.J. von Gutfeld, "Enhancing Ribbon Transfer users Laser Printing" *IBM Tech. Disl. Bull.*, vol. 17, No. 6 p. 1807, Nov. 1974.*

Laser and Particle–Beam Chemical Processing for Microelectronics, Dec. 1–3, 1987 *Materials Research Society Symposium Proceedings*: vol. 101 (1988), pp. 237–243. Baseman et al "Laser Induced Forward Transfer".

"Laser–Induced Forward Transfer of Aluminium," *Applied Science 52* No month (1991), pp. 303–309. Schultze et al.

"Ar$^+$ Laser–Induced Forward Transfer (LIFT): A Novel Method For Micrometer–Size Surface Patterning," *Applied Surface Science 69* no month (1993), pp. 317–320. Toth et al.

Laser–Assisted Fabrication of Thin Films and Microstructures, *SPIE–The International Society for Optical Engineering*, Aug. 17–19, 1993, vol. 2045, pp. 126–132. Szörenyi et al "Surface patterning . . . ".

"Metal Pattern Deposition By Laser–Induced Forward Transfer," *Applied Surface Science 86*, (1995) pp. 196–201, Kántor et al. No month.

(List continued on next page.)

Primary Examiner—Marianne Padgett
(74) Attorney, Agent, or Firm—Crompton, Seager & Tufte LLC

(57) ABSTRACT

Devices and methods for fabricating medical devices are disclosed. A device in accordance with the present inventions includes a laser beam source capable of producing a laser beam, a carrier coupled to a carrier motion actuator capable of moving the carrier relative to the laser beam, and a workpiece motion actuator capable of moving a workpiece relative the laser beam. A method in accordance with the present invention includes the steps of positioning the carrier between the laser beam source and the workpiece, illuminating a portion of the carrier with the laser beam, moving the carrier relative to the laser beam, and moving the workpiece relative to the laser beam.

9 Claims, 12 Drawing Sheets

OTHER PUBLICATIONS

Summaries of papers presented at the Conference on Lasers and Electro–Optics, *1996 Technical Digest Series*, Conference Edition, vol. 9, Jun. 2–7, 1996, pp. 377 and 378, Poon et al "Laser–Induced . . . ".

"A Study of the Mechanism of Metal Desposition by the Laser–Induced Forward Transfer Process[a)]," *J. Vac. Sci. Technol.*, b 5(5), Sep./Oct. 1987, pp. 1490–1494. Adrian et al.

Summaries of papers presented at the Conference on Lasers and Electro–Optics, *Technical Digest*, Conference Edition, vol. 6 (1998), May Nakata et al "Laser–induced forward . . . " p. 158 (CTu M28).

"The Mechanism of the Local Laser Induced Front Transfer of the Films," *SPIE*, vol. 1856 (1993), No month.

Lasers As Tools for Manufacturing of Durable Goods and Microelectronics, *SPIE*, vol. 2703 Jan. 20–Feb. 2 (1996) pp. 541–549. Veiko et al "Local Laser–induced film transfer: Theory & applications".

"Formation of Metal Silicon Alloys by Laser Induced Forward Transfer," Research Disclosure, Jul. 1988, 1 sheet.#29196 Anonymous.

* cited by examiner

LASER DEPOSITION OF ELEMENTS ONTO MEDICAL DEVICES

FIELD OF THE INVENTION

The present invention relates generally to medical devices and associated methods of manufacture. More particularly, the present invention relates to the application of layers of material to the surface of medical devices.

BACKGROUND OF THE INVENTION

In recent years there has been a great deal of interest in the development of devices which enable physicians to perform medical procedures in a way which is minimally invasive to the body of the patient. These devices have been utilized to access many sites in the human body. Examples include coronary vasculature, cerebral vasculature, peripheral vasculature, and the gastrointestinal tract. During the fabrication of these devices, it is frequently necessary to apply an overlaying material to the outer surface of a radial cylindrical device. Many examples of the need to apply overlaying materials to generally cylindrical medical devices may be found in devices which are utilized to assure that the heart is properly perfused with blood.

Assuring that the heart muscle is adequately supplied with oxygen is critical to sustaining the life of a patient. To receive an adequate supply of oxygen, the heart muscle must be well perfused with blood. In a healthy heart, blood perfusion is accomplished with a system of blood vessels and capillaries. However, it is common for the blood vessels to become occluded (blocked) or stenotic (narrowed). A stenosis may be formed by an atheroma which is typically a harder, calcified substance which forms on the walls of a blood vessel. Individual stenotic lesions may be treated with a number of minimally invasive medical procedures including angioplasty and atherectomy.

Angioplasty techniques typically involve the use of a balloon catheter and a guide catheter. During this procedure, the distal end of the guide catheter is typically inserted into the femoral artery located near the groin of the patient. The guide catheter is urged through the vasculature of the patient until its distal end is proximate the restriction. In many cases, the distal end of the guide catheter is positioned in the ostium of the coronary artery.

In order to determine the location of the distal tip of the catheter, a ring of radiopaque material may be disposed proximate the distal tip of the guide catheter. This ring of radiopaque material produces a relatively bright signal on a fluoroscopy screen, allowing the physician to "see"where the tip of the catheter is located relative to the patients anatomy. Radiopaque markers are one example of an element which may be fabricated by applying an overlaying material to a generally cylindrical medical device.

Once the guide catheter has been properly positioned, the balloon catheter may be fed through a lumen in the guide catheter. The balloon is advanced beyond the distal end of the guide catheter until it is positioned proximate a restriction in a diseased vessel. The balloon is then inflated and the restriction in the vessel is opened. The balloon catheter may also include a radiopaque ring to aid the physician in positioning the balloon proximate the restriction.

Because a wide range of sizes and styles of catheters are used in angioplasty procedures it is desirable that the different sizes be readily identifiable. Identifying marks may be placed on a catheter by applying a layer of marking material. The marking material may define alphabetic or numeric characters. Alternately, the color or shape of the material may be used as an identifier. Visual identifiers are an additional example of an element which may be fabricated by applying an overlaying material to a generally cylindrical medical device.

To prevent subsequent closure of the vessel in the restricted area (restenosis) after an angioplasty procedure, a physician may implant a stent. Stents are normally comprised of a generally cylindrical skeletal frame which includes openings and a lumen which extends longitudinally through the stent. A variety of processes are known for fabricating stents. A stent may consist of a plurality of filaments or fibers which are wound or braided together to form a continuous structure. Alternately, the skeletal frame of a stent may be formed by removing material from a tubular element using a laser cutting process. Two general types of stents are commonly used; self-expanding and balloon expandable. A stent may be comprised of any biocompatible material possessing the structural and mechanical attributes necessary for supporting a diseased vessel.

A stent may also include one or more layers of additional material overlaying the skeletal frame. Examples of such materials include a drug release coating comprising a therapeutic substance in a polymeric carrier. Drug release coatings are an additional example of an element which may be fabricated by applying an overlaying material to a generally cylindrical medical device.

As mentioned above, individual stenotic lesions may also be treated with an atherectomy procedure. During an atherectomy procedure, a stenotic lesion is mechanically cut or abraded away from the blood vessel wall. A catheter used in an atherectomy procedure may include an ablating burr having an abrasive coating. This abrasive coating may be fabricated by applying a layer of material to a body member of the ablating burr. This abrasive material is an additional example of an element which may be fabricate by applying an overlaying material to a generally cylindrical medical device.

Percutaneous myocardial revascularization (PMR) is an additional procedure which may be performed to improve perfusion of the heart muscle. PMR is typically used in clinical situations where angioplasty and atherectomy may not achieve the desired results. As described above, angioplasty, and atherectomy procedures have both been found effective in treating individual stenotic lesions in relatively large blood vessels. However, the heart muscle is perfused with blood through a network of small vessels and capillaries. In some cases, a large number of stenotic lesions may occur in a large number of locations throughout this network of small blood vessels and capillaries. The torturous path and small diameter of these blood vessels limit access to the stenotic lesions. The sheer number and small size of these stenotic lesions make techniques such as angioplasty, and atherectomy impractical for some patients.

When techniques which treat individual lesions are not practical, a technique known as percutaneous myocardial revascularization (PMR) may be used to improve the oxygenation of the myocardial tissue. A PMR procedure generally involves the creation of holes, craters or channels directly into the myocardium of the heart. PMR was inspired in part by observations that reptilian heart muscles are supplied with oxygen primarily by blood perfusing directly from within heart chambers to the heart muscle. This contrasts with the human heart, which is supplied by coronary vessels receiving blood from the aorta. Positive clinical results have been demonstrated in human patients receiving PMR treatments. These results are believed to be caused in part by blood flowing within a heart chamber through channels in myocardial tissue formed by PMR. Increased blood flow to the myocardium is also believed to be caused in part by the healing response to wound formation. Specifically, the formation of new blood vessels is believed to occur in response to the newly created wound. This response is sometimes referred to as angiogenisis. In addition to promoting increased blood flow, it is also believed that PMR improves a patient's condition through denervation. Denervation is the elimination of nerves. The creation of wounds during a PMR procedure results in the elimination of nerve endings which were previously sending pain signals to the brain as a result of hibernating tissue.

In a PMR procedure, hibernating heart tissue may be ablated using radio frequency energy. In this procedure radio frequency energy is delivered to the hibernating heart tissue using a catheter which includes one or more conductors, and one or more electrodes. These conductors and electrodes may be fabricated by applying one or more layers to the outer surface of a generally tubular member. For example, a conductive material such as gold may be applied to the generally tubular member to create electrodes, conductors, and or antennas. These electrically conductive elements are an additional example of an element which may be fabricated by applying an overlaying material to a generally cylindrical medical device. Yet another example of elements which may be fabricated by applying an overlaying material to a generally cylindrical medical device include elements adapted to provide desirable structural characteristics, for example, strain relief's, walls of varying stiffness, etc.

SUMMARY OF INVENTION

The present invention relates generally to medical devices and associated methods of manufacture. More particularly, the present invention relates to the application of layers of material to the surface of medical devices. A system is disclosed which is capable of depositing material onto a workpiece.

In a presently preferred embodiment, the workpiece is a medical device having a generally cylindrical surface. Also, in a presently preferred method, the workpiece is coupled to a workpiece motion control system which is capable of moving workpiece. The workpiece motion control system may include one or more linear actuators and one or more rotary actuators.

A carrier is positioned in close proximity to the workpiece. The carrier is coupled to a carrier motion control system, which may include one or more linear actuators and one or more rotary actuators. Several embodiments of the carrier and the carrier motion control system are disclosed. In a presently preferred embodiment, the carrier comprises a substantially laser transparent substrate having a layer of writing material overlaying at least a portion of one surface. Also in a presently preferred embodiment, the writing material comprises a sacrificial layer and a projectile layer.

The system further includes a laser source which is capable of directing a laser beam. In a presently preferred embodiment, the laser source is stationary. In other possible embodiments, the laser source may be coupled to a laser motion control system which may include a plurality of linear actuators and a plurality of rotary actuators. The actuators of the laser motion control system may be used to position the laser source so that the laser beam eliminates a portion of the carrier. A system controller may be utilized to selectively activate and coordinate the laser source, the laser motion control system, the carrier motion control system, and the workpiece motion control system.

A catheter in accordance with the present invention may include a strain relief or a radiopaque marker disposed on one of its surfaces utilizing a method in accordance with the present invention. Other elements which may be deposited on the surface of a workpiece utilizing methods in accordance with the present invention include: visual markers, conductors, electrodes, and abrasive layers.

A method of applying material to a work surface in accordance with the present invention may begin with the step of coupling the workpiece to the workpiece motion system. The carrier may likewise be coupled to the carrier motion control system. The carrier may be positioned so that it is in close proximity to a surface of the workpiece. The laser motion control system may be used to position the laser source such that the laser beam illuminates a portion of the carrier and carrier is interposed between laser source and workpiece.

The system controller may be utilized to selectively activate the laser source, the laser motion control, the carrier motion control system, and the workpiece motion control system. Relative motion is selectively created between the carrier and the laser beam to provide a constant supply of writing material. Relative motion is selectively created between the workpiece and the laser beam to make new portions of the workpiece surface available to receive material.

DETAILED DESCRIPTION OF THE INVENTION

The following detailed description should be read with reference to the drawings, in which like elements in different drawings are numbered identically. The drawings which are not necessarily to scale, depict selected embodiments and are not intended to limit the scope of the invention.

Examples of constructions, materials, dimensions, and manufacturing processes are provided for selected elements. All other elements employ that which is known to those of skill in the field of the invention. Those skilled in the art will recognize that many of the examples provided have suitable alternatives which may be utilized.

Figure 1:
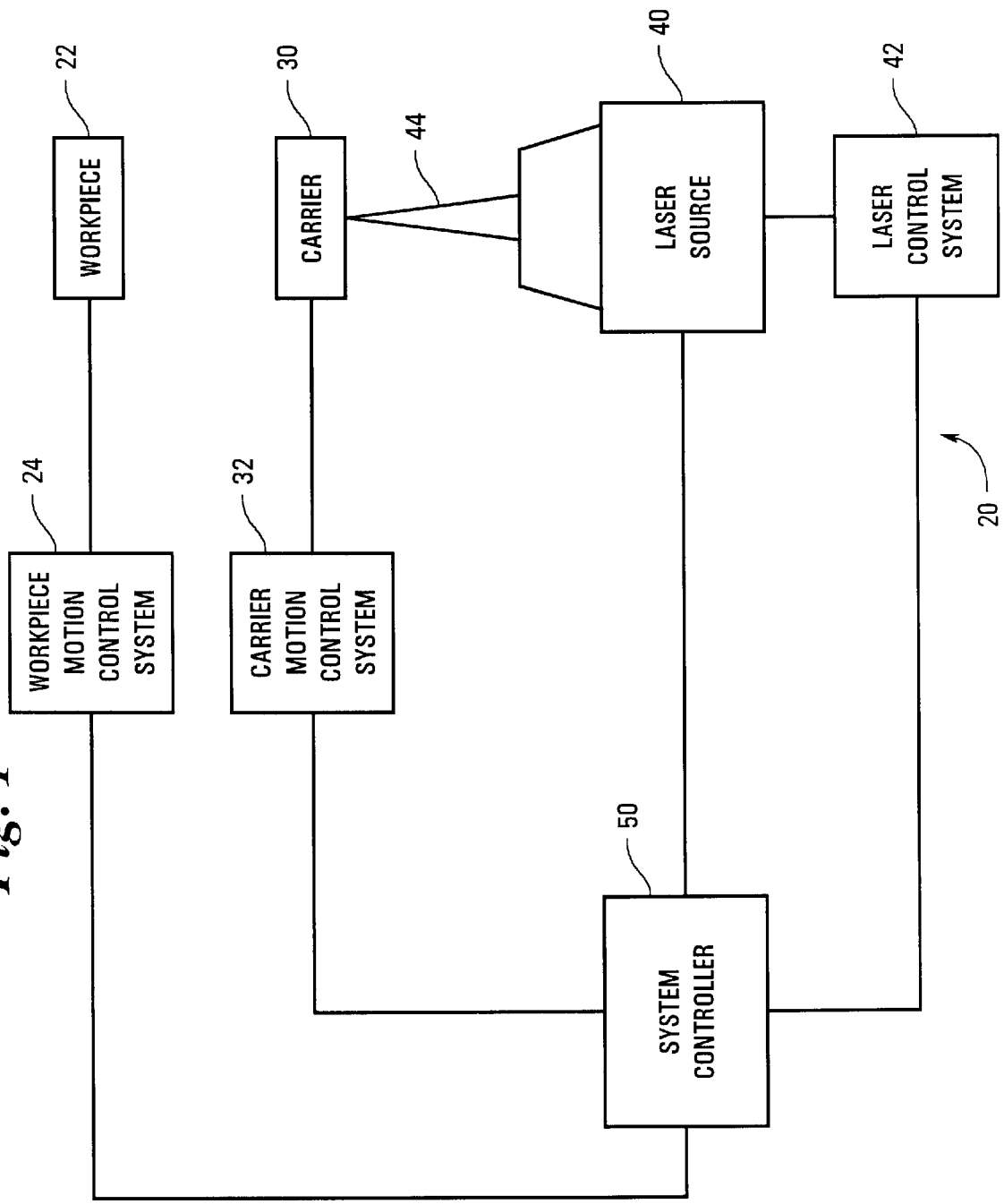
FIG. 1 is a block diagram of a fabrication system capable of depositing material onto a workpiece, the workpiece may have a flat surface as illustrated in FIG. 1, or a curved surface.

FIG. 1 is a block diagram of a fabrication system 20 capable of depositing material onto a workpiece 22. In a presently preferred embodiment, workpiece 22 is a medical device having a generally cylindrical surface. Workpiece 22 is coupled to a workpiece motion control system 24 which is capable of moving workpiece 22. Workpiece motion control system 24 may include one or more linear actuators 26 and one or more rotary actuators 28.

A carrier 30 is positioned in close proximity to workpiece 22. Carrier 30 is coupled to a carrier motion control system 32. Carrier motion control system 32 may include one or more linear actuators and one or more rotary actuators 28. In a presently preferred embodiment, carrier 30 comprises a substantially laser transparent substrate 34. A layer of writing material overlays at least a portion of one surface of the substantially laser transparent substrate.

System 20 further includes a laser source 40 which is capable of directing a laser beam 44. Laser source 40 is coupled to a laser control system 42. In a presently preferred embodiment, laser source 40 is stationary. Embodiments are possible in which laser control system 42 includes a plurality of linear actuators and a plurality of rotary actuators. The actuators of laser control system 42 may be used to position laser source 40 so that laser beam 44 illuminates a portion of carrier 30. Laser control system 42 may also be utilized to adjust the focus of laser beam 44, by adjusting the distance between laser source 40 and carrier 30.

As shown in FIG. 1, laser source 40 is also coupled to system controller 50. System controller 50 may be used to selectively illuminate a portion of carrier 30 with laser beam 44. A number of methods and devices may be used to accomplish the selective illuminate of carrier 30, including electrical switches and mirrors. System controller 50 may also be utilized to selectively activate laser motion control system 42, carrier motion control system 32, and workpiece motion control system 24. As shown in FIG. 1, system controller 50 is coupled to each of these elements.

As described previously, workpiece motion control system 24, carrier motion control system 32, and laser motion control system 42 may all include one or more linear actuators. Those of skill in the art will appreciate that many embodiments of a linear actuator are possible without deviating from the spirit and scope of the present invention. Linear actuators which may be suitable in some applications are commercially available from Aerotech of Pittsburgh, Pa. and Anorad of Hauppauge, N.Y.

As described previously, workpiece motion control system 24, carrier motion control system 32, and laser motion control system 42 may all include one or more rotary actuators. Those of skill in the art will appreciate that many embodiments of a rotary actuator are possible without deviating from the spirit and scope of the present invention. Rotary actuators which may be suitable in some applications are commercially available from Aerotech of Pittsburgh, Pa. and Anorad of Hauppauge, N.Y.

Figure 2:
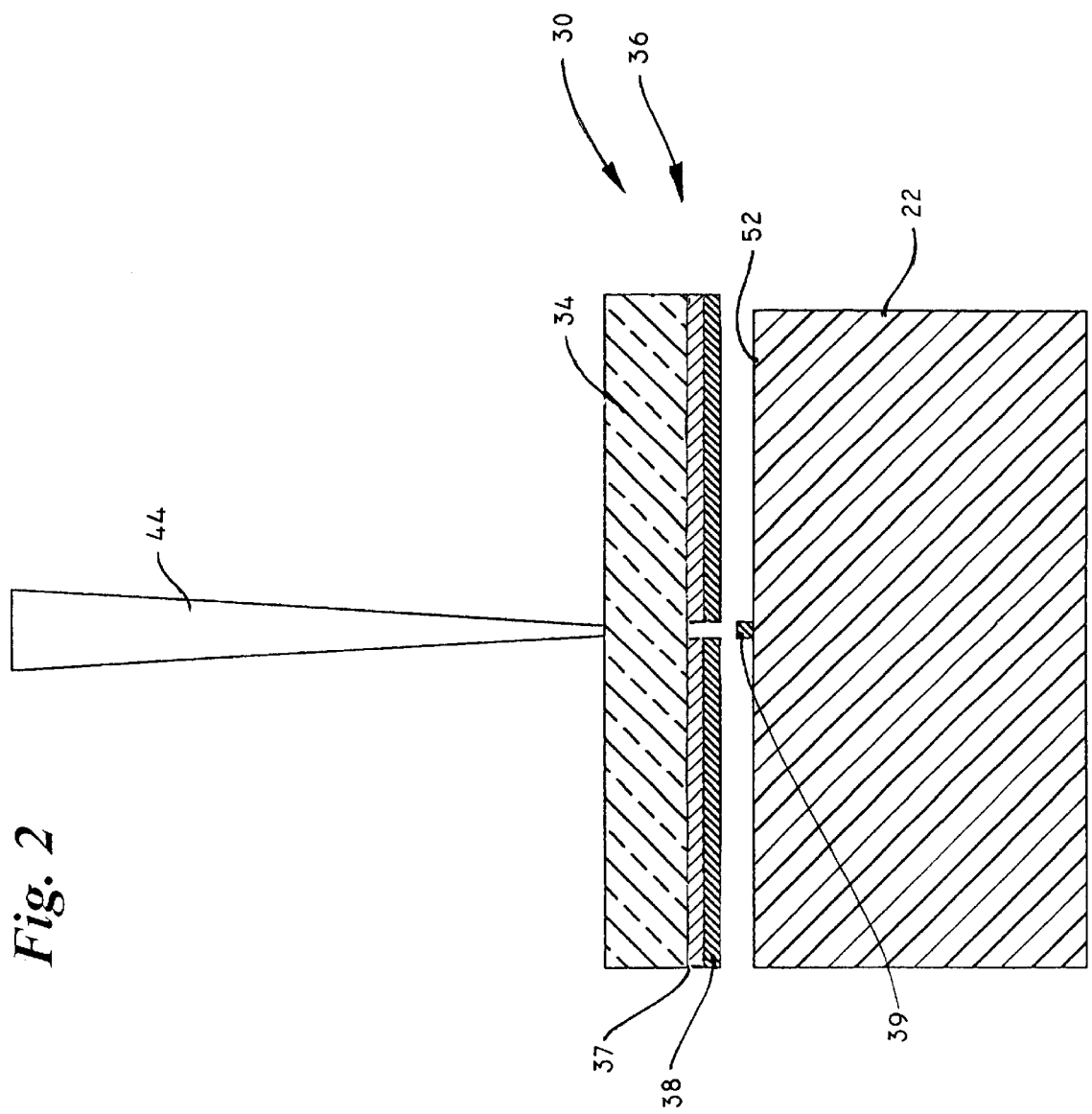
FIG. 2 is a cross sectional view of a substantially flat workpiece, a laser beam, and a carrier.

FIG. 2 is a cross sectional view of a substantially flat workpiece 22, a laser beam 44, and a carrier 30. Carrier 30 comprises a substrate 34 and a layer of writing material 36 overlying one surface of substrate 34. In the embodiment of FIG. 2, writing material 36 includes a sacrificial portion 37 and a projectile layer 38.

As shown in FIG. 2, writing material 36 of carrier 30 is positioned in close proximity to a surface 52 of workpiece 22. Laser beam 44 is adapted to illuminate a portion of carrier 30. In a method in accordance with the present invention, laser beam 44 heats sacrificial layer 37 causing it to be vaporized. The vaporization of sacrificial layer 37 drives a projectile portion 39 of projectile layer 38 toward a surface 52 of workpiece 22 at high speed causing projectile portion 39 to bond to workpiece 22.

In a presently preferred embodiment, substrate 34 is comprised of a material which is substantially transparent to laser beam 44. Suitable materials for substrate 34 include polymeric and non-polymeric materials. Examples of polymeric materials which may be suitable in some applications include polyethylene (PE), polypropylene (PP), polyvinyl acetate (PVA), polystyrene (PS), polyethylene terephthalate (PET), polybutylene terephthalate (PBT), and polytetrafluoroethylene (PTFE). Examples of non-polymeric materials which may be suitable in some applications include glass, quartz, and sapphire.

In a presently preferred embodiment, sacrificial layer 37 is comprised of a material which is effective at absorbing laser energy. Materials which may be suitable in some applications include carbon, polysulfone, and polyimide. In a presently preferred method, sacrificial layer 37 does not decompose at high temperature and does not chemically interact with the material of projectile layer 38. However, embodiments of the present method have been envisioned in which sacrificial layer 37 and projectile layer 38 do interact chemically. For example, in one method in accordance with the present invention, a layer of nickel and a layer of titanium are utilized and the material which is deposited on the work piece is a nickel titanium alloy. Projectile layer 38 may be any material which comprises a desirable addition to workpiece 22. Examples of elements which may be fabricated using the process illustrated in FIG. 2 will be illustrated in the figures which follow.

Figure 3:
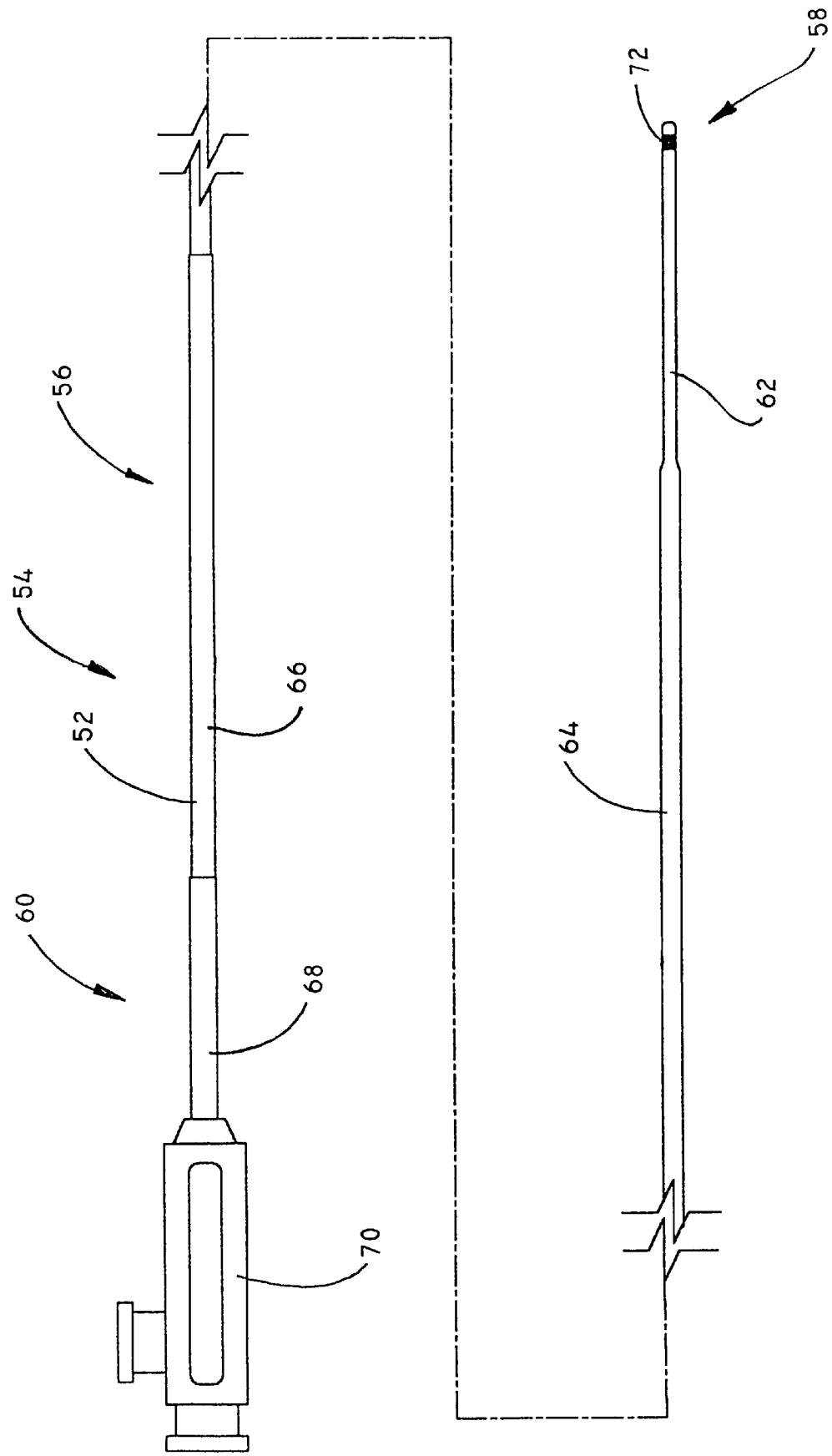
FIG. 3 is a plan view of a catheter having a strain relief and a radiopaque marker in accordance with the present invention.

FIG. 3 is a plan view of a catheter 54. Catheter 54 includes an elongate shaft 56 having a distal portion 58 and a proximal portion 60. Elongate shaft 56 is comprised of a distal tubular member 62, a proximal tubular member 66, and a middle tubular member 64. A hub 70 is fixed to the proximal end of proximal tubular member 66. A strain relief 68 is disposed about an outer surface 52 of proximal tubular member 66. Hub 70 and strain relief 68 enable a physician to connect other devices to catheter 54. Hub 70 and strain relief 68 also provide a convenient place for a physician to apply longitudinal or rotational forces in order to manipulate catheter 54. Strain relief 68 provides structural support to proximal tubular member 66 to make kinking less likely when these forces are applied to hub 70. Strain relief 68 may be formed by applying material to outer surface 52 of proximal tubular member 66 using a method in accordance with the present invention. Those of skill in the art will appreciate that strain relief 68 may be any shape or size without deviating from the spirit and scope of the present invention. For example, embodiments of strain relief 68 have been envisioned in which strain relief 68 tapers from a generally wider diameter to a generally more narrow diameter. Strain relief 68 may be any material which provides the desired structural support. Examples of materials which may be suitable in some applications include polyethylene (PE), polypropylene (PP), polyvinylchloride (PVC), polyurethane, polytetrafluoroethylene (PTFE), polyether block amide (PEBA), stainless steel, nickel, titanium alloy and aluminum.

A radiopaque marker 72 is disposed about an outer surface 52 of distal tubular member 62. During a surgical procedure radiopaque marker 72 assists a physician in determining the location of the distal tip of catheter 54 relative to a patients anatomy. Radiopaque marker 72 appears as a relatively bright image on a fluoroscopy screen, allowing the physician to "see" where the tip of the catheter is located. Radiopaque marker 72 may be any material which provides the desired level of radiopacity. Examples of materials which may be suitable in some applications include gold, platinum, tungsten, iron, silver, and thermoplastic material loaded with a radiopaque filler. Examples of radiopaque filler which may be suitable in some applications include barium sulfate, bismuth subcarbonate, bismuth trioxide, bismuth oxychloride, bismuth subcarbonate, tungsten, and depleted uranium. Radiopaque marker 72 may be formed by applying material to the outer surface of distal tubular member 62 using a method in accordance with the present invention.

Figure 4:
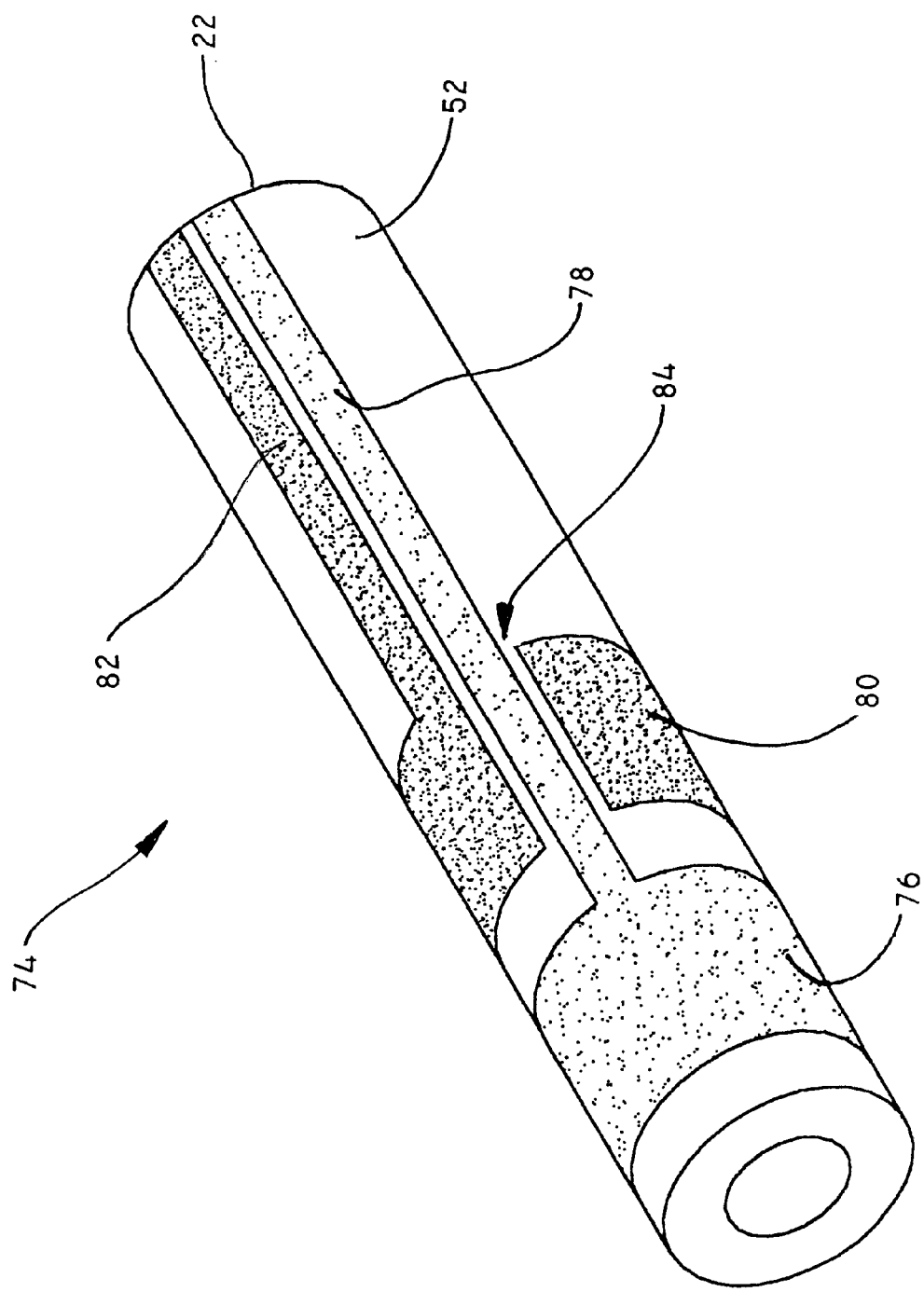
FIG. 4 is a perspective view of an assembly including a generally tubular member having an outer surface, and a first electrode, a second electrode, a first conductor, and a second conductor disposed on the outer surface of the generally tubular member.

FIG. 4 is a perspective view of an assembly 74 including a workpiece 22 having a surface 52. Workpiece 22 may form a portion of a catheter. A first electrode 76 is disposed about outer surface 52 of workpiece 22. First electrode 76 is coupled to a first conductor 78. A second electrode 80 is also disposed about outer surface 52 of workpiece 22. Second electrode 80 includes a gap 84 which is adapted to allow first conductor 78 to pass without making electrical conduct. Second electrode 80 is coupled to a second conductor 82.

First electrode 76, second electrode 80, first conductor 78, and second conductor 82 may all be comprised of any material which provides the desired level of electrical conductivity. Examples of materials which may be suitable in some applications include gold, silver, and platinum. First electrode 76 and second electrode 80 may be used in conjunction with a number of medical procedures. Examples of such procedures include cardiac pacing, electrocardiograph recording, and percutaneous myocardial revascularization (PMR).

Those of skill in the art will appreciate that other embodiments of assembly 74 are possible without deviating from the spirit and scope of the present invention. For example, first conductor 78 and second conductor 82 may form an electrical connection with elements other than electrodes. Examples of elements which may be coupled to first conductor 78 and second conductor 82 include pressure sensors, temperature sensors, flow sensors, and electromagnets.

Figure 5:
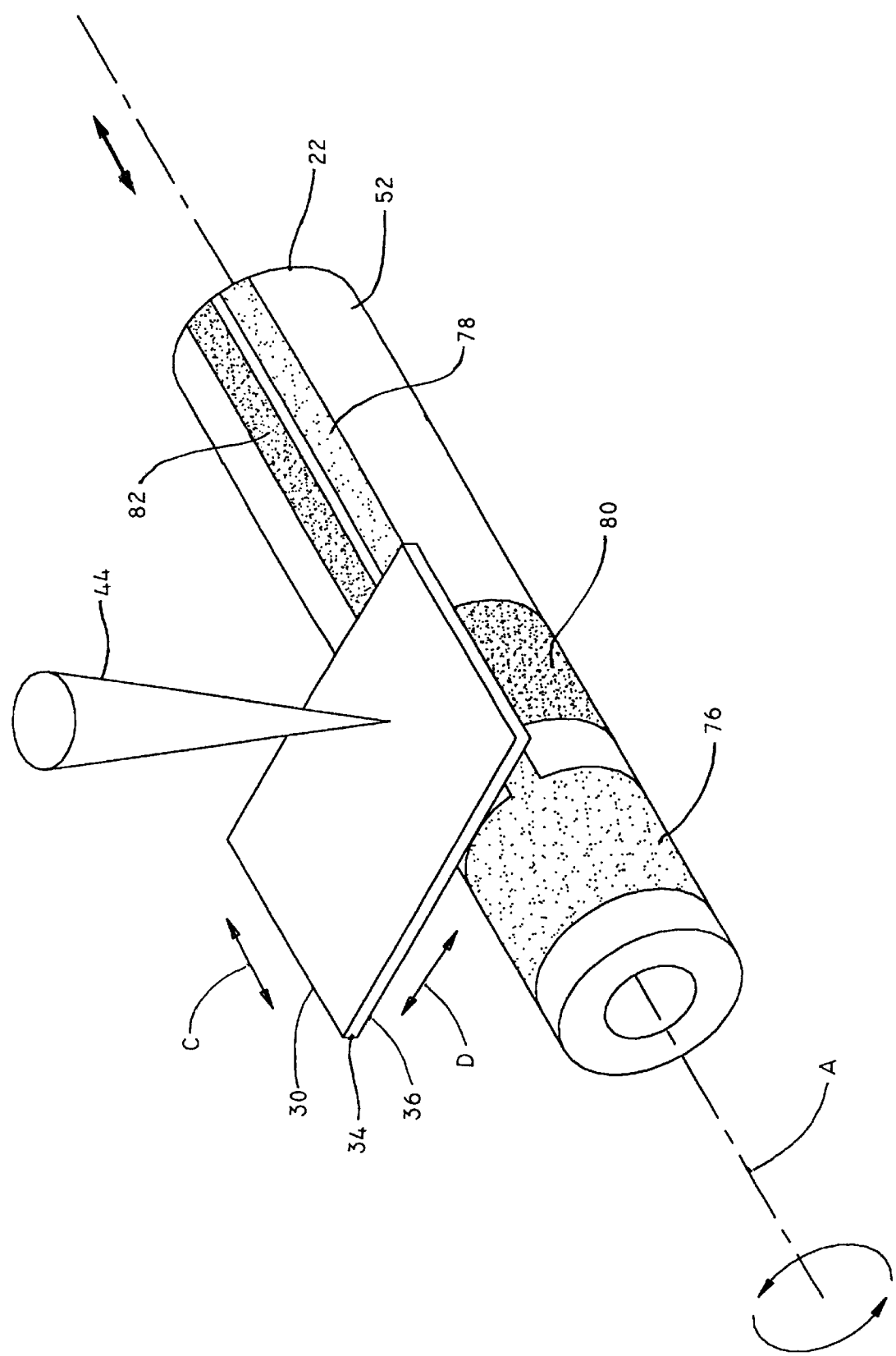
FIG. 5 is a fragmentary perspective view illustrating a method which may be utilized to fabricate electrodes and conductors of any geometry.

FIG. 5 is a fragmentary perspective view illustrating a method which may be utilized to fabricate first electrode 76, second electrode 80, first conductor 78, and second conductor 82 of FIG. 4. In FIG. 5 a carrier 30 is located proximate workpiece 22. As in FIG. 4, carrier 30 includes a substrate 34 having a writing material 36 overlaying at least a portion of one surface. In a method in accordance with the present invention, workpiece 22 is coupled to a workpiece motion control system (not shown in FIG. 5). In the embodiment of FIG. 5, the workpiece motion control system includes a rotary actuator (not shown). The rotary actuator is adapted to rotate workpiece 22 about an axis of rotation A. In a presently preferred method, axis A overlays the longitudinal axis of workpiece 22. Also in the embodiment of FIG. 5, the workpiece motion control system includes a linear actuator (not shown). The linear actuator is adapted to move workpiece 22 longitudinally along axis A. A laser source (not shown) is utilized to generate a laser beam 44.

Carrier 30 is positioned between the laser source and workpiece 22. As shown in FIG. 5, carrier 30 is in close proximity of outer surface 52 of workpiece 22. In a presently preferred embodiment, carrier 30 comprises a substantially laser transparent substrate 34, and a writing material 36 overlaying the substantially laser transparent substrate 34. In the embodiment of FIG. 5, writing material 36 overlays the side of substrate 34 which adjoins outer surface 52 of workpiece 22. In the embodiment of FIG. 5, carrier 30 is coupled to a carrier motion control system. The carrier motion control system includes a first linear actuator which is capable of moving carrier 30 along an axis C. The carrier motion control system also includes a second linear actuator (not shown) which is capable of moving carrier 30 along an axis D.

As shown in FIG. 5, first electrode 76, second electrode 80, first conductor 78, and second conductor 82 have all been formed by selectively depositing material from writing material 36 onto outer surface 52 of workpiece 22. A method of applying material in accordance with the present invention may be described with reference to FIG. 5. The process may begin with the step of coupling workpiece 22 to a workpiece motion system. Carrier 30 may likewise be coupled to a carrier motion control system. Carrier 30 may be positioned so that it is in close proximity to outer surface 52 of workpiece 22. A laser motion control system may be used to position the laser source such that laser beam 44 illuminates a portion of carrier 30 interposed between the laser source and workpiece 22.

A system controller may be utilized to selectively activate the laser source, laser motion control system, carrier motion control system, and workpiece motion control system. Carrier 30 is selectively moved relative to the laser beam to provide a constant supply of writing material 36. First electrode 76 and second electrode 80 may be formed by rotating workpiece 22 while laser beam 44 illuminates a portion of carrier 30. The laser source may be moved as required to apply writing material 36 to new portions of outer surface 52 of workpiece 22. The rotation of generally tubular member may be stopped and started as required to create the pattern of writing material 36 shown in FIGS. 4 and 5. Likewise, laser beam 44 may be selectively applied to create the desired pattern. It should be understood that steps may be omitted from this process and the order of the steps may be changed without deviating from the spirit or scope of the invention.

As described previously, the workpiece motion control system, carrier motion control system, and laser motion control system may all include one or more linear actuators and one or more rotary actuators. It should be understood that the workpiece motion control system, carrier motion control system, and laser motion control system may include any number of linear actuators and any number of rotary actuators without deviating from the spirit and scope of the present invention.

Figure 6:
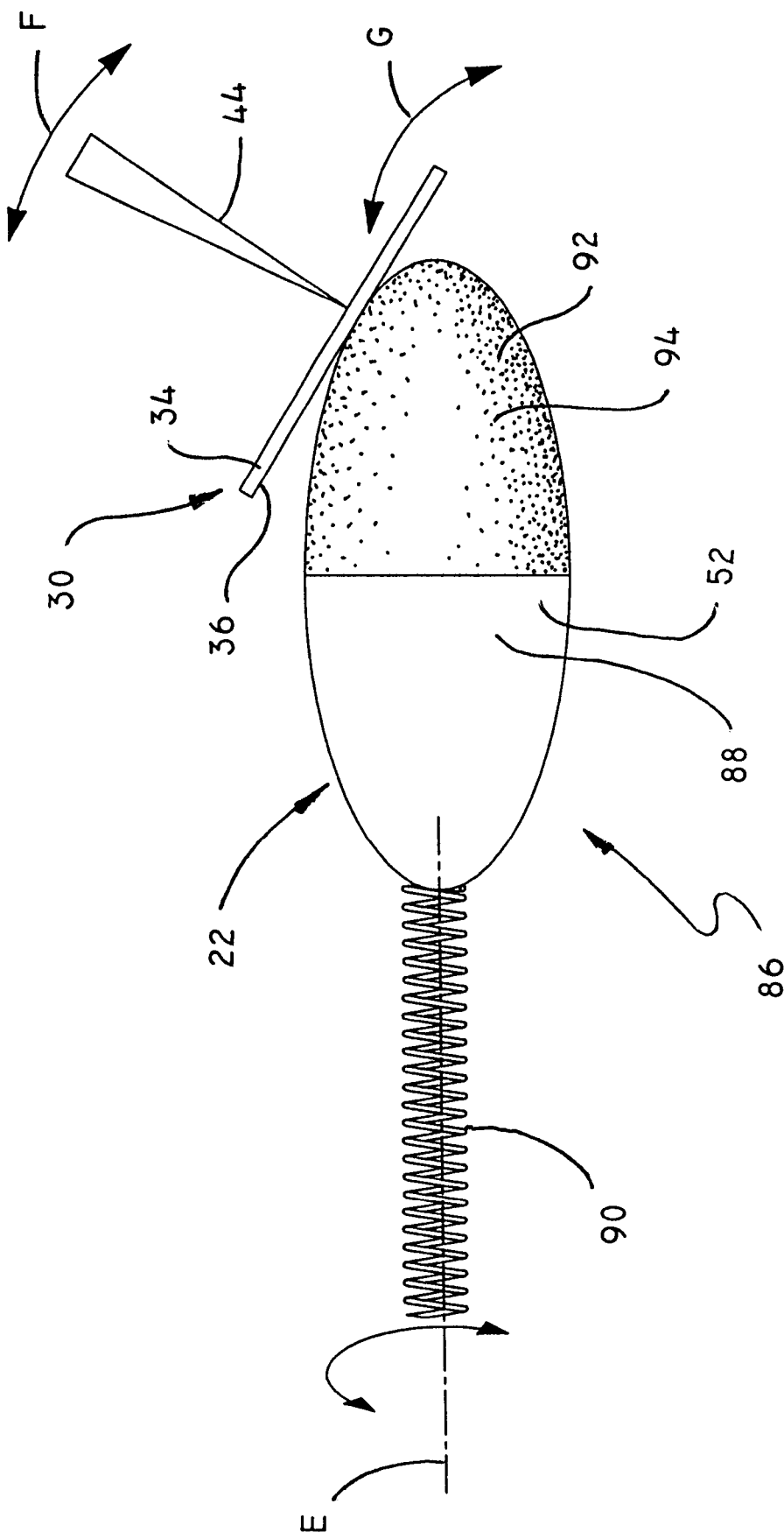
FIG. 6 is a plan view an ablating burr having an abrasive layer in accordance with the present invention.

FIG. 6 is a plan view illustrating an additional method in accordance with the present invention. An ablating burr 86 is illustrated in FIG. 6. In a presently preferred embodiment, ablating burr 86 is adapted for use in an atherectomy procedure. Ablating burr 86 includes a body member 88 which is fixed to the distal end of a shaft 90. As shown in FIG. 6, the shape of body member 88 may generally be described as an ellipsoidal rotation.

In FIG. 6, a carrier 30 is located proximate a surface 52 of body member 88. As in the previous embodiments, carrier 30 includes a substrate 34 having a writing material 36 overlaying at least a portion of one surface. In a method in accordance with the present invention, ablating burr 86 is coupled to a workpiece motion control system (not shown in FIG. 6). In the embodiment of FIG. 6, the workpiece motion control system includes a plurality of actuators. The workpiece motion control system is adapted to rotate workpiece 22 about an axis of rotation E. In a presently preferred method, axis E overlays the longitudinal axis of ablating burr 86.

A laser source (not shown) is utilized to generate a laser beam 44. The laser source is coupled to a laser motion control system (not shown). In the embodiment of FIG. 6, the laser motion control system includes a plurality of actuators which are capable of moving the laser source along a path F. As shown in FIG. 6, path F generally follows the shape of surface 52 of ablating burr 86.

Carrier 30 is positioned between the laser source and the ablating burr 86. As shown in FIG. 6, carrier 30 is in close proximity of surface 52 of ablating burr 86. In a presently preferred embodiment, carrier 30 comprises a substantially laser transparent substrate 34, and a writing material 36 overlaying the substantially laser transparent substrate. In the embodiment of FIG. 6, writing material 36 overlays the side of substrate 34 which adjoins surface 52 of ablating burr 86. In the embodiment of FIG. 6, carrier 30 is coupled to a carrier motion control system (not shown). The Carrier motion control system includes a plurality of actuators which are adapted to move carrier 30 along a path G. Path G generally follows the shape of surface 52 of ablating burr 86. As shown in FIG. 6, an abrasive layer 92 has been selectively deposited on surface 52 of ablating burr 86.

A method of fabricating an ablating burr may be described with reference to FIG. 6. The process may begin with the step of coupling ablating burr 86 to a workpiece motion system. Carrier 30 may likewise be coupled to a carrier motion control system. Carrier 30 may be positioned so that it is in close proximity to surface 52 of ablating burr 86. A laser motion control system may be used to position a laser source such that laser beam 44 illuminates a portion of carrier 30 interposed between the laser source and the ablating burr 86.

System controller (not shown) may be utilized to selectively activate the laser source, laser motion control, carrier motion control system, and workpiece motion control system. Carrier 30 is selectively moved relative to the laser beam to provide a constant supply of writing material 36. In the embodiment of FIG. 6, writing material 36 includes abrasive particles 94.

Figure 7:
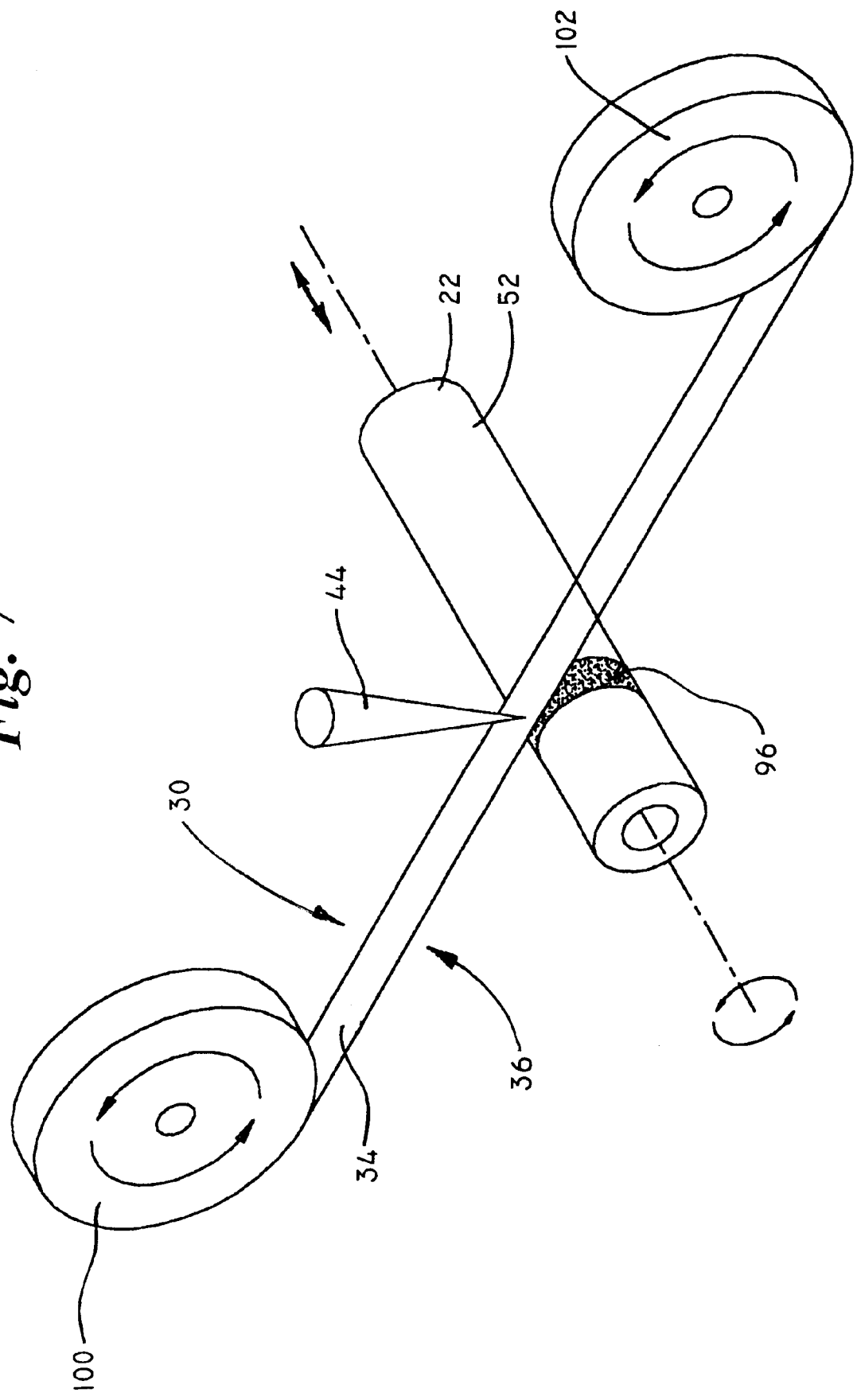
FIG. 7 is a perspective view of a generally tubular workpiece having a visual marker disposed about its outer surface, a substantially flexible carrier including a layer of writing material, and a laser beam.

FIG. 7 is a perspective view of a workpiece 22 having a visual marker 96 disposed about its outer surface 52. Visual marker 96 is formed from material which has been remove from a carrier 30 and deposited on outer surface 52. In the embodiment of FIG. 7, carrier 30 comprises an elongate, substantially flexible substrate 34. As in the previous embodiments, a writing material 36 overlays one surface of substrate 34.

In FIG. 7, a first portion of carrier 30 is disposed about a payoff reel 100 and a second portion of carrier 30 is disposed about a take up reel 102. Payoff reel 100 and take up reel 102 are each coupled to rotary actuators (not shown). The reels 100, 102 are rotated such that carrier 30 is fed off of payoff reel 100 and wrapped around take up reel 102. Between payoff reel 100 and take up reel 102, each portion of carrier 30 passes in close proximity to a workpiece 22.

A laser beam 44 is positioned so that it illuminates a portion of carrier 30 proximate workpiece 22. Laser beam 44 may be selectively activated to apply writing material 36 to workpiece 22. Carrier 30 is wound from payoff reel 100 to take up reel 102 such that it provides a constant supply of writing material 36. Workpiece 22 is coupled to a workpiece motion system which moves workpiece 22 to make new portions of its surface available for deposition of writing material 36. The rotary actuators, linear actuators, laser beam 44, laser control system, and workpiece motion control system may all be selectively activated to form visual marker 96.

Figure 8:
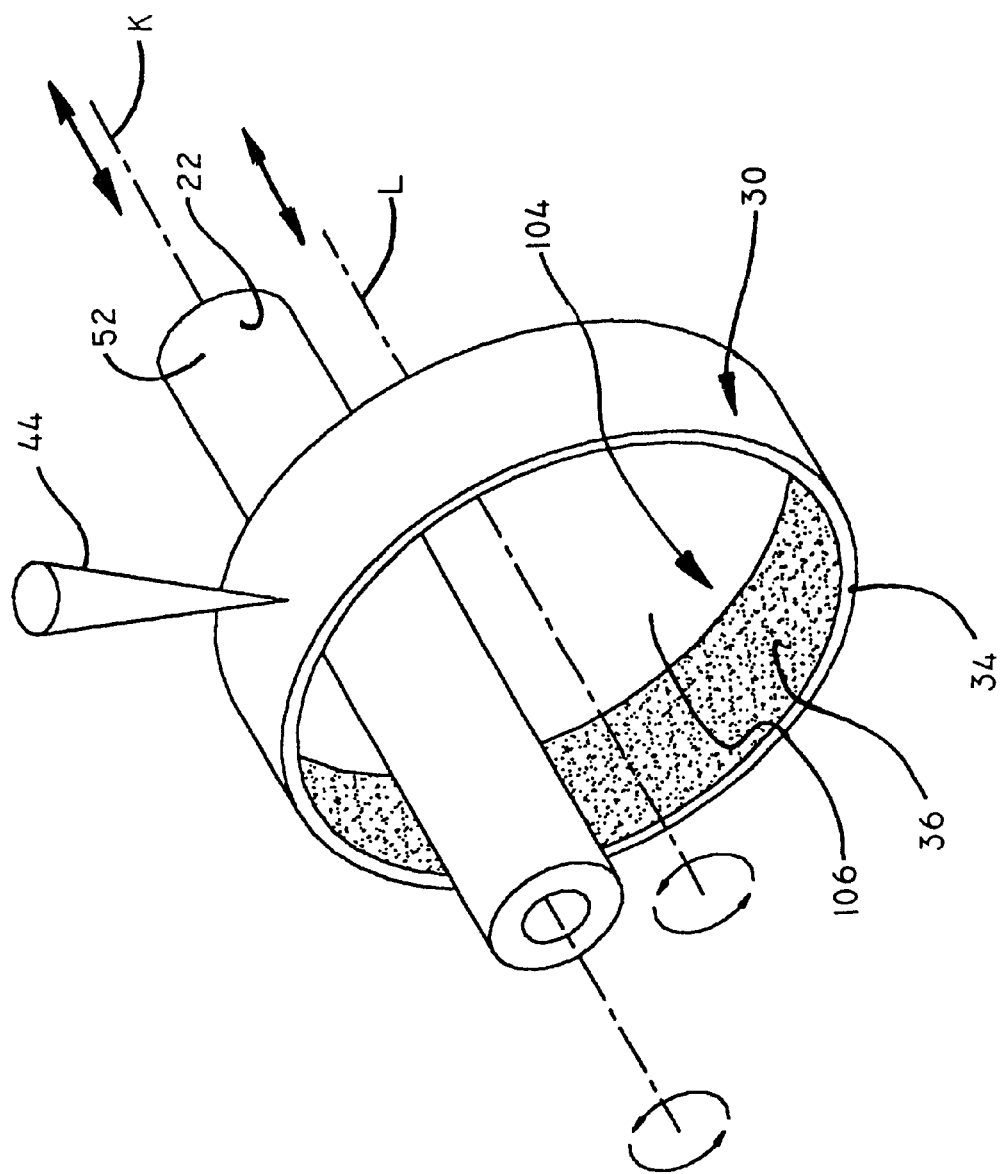
FIG. 8 is a perspective view of a generally tubular workpiece, a substantially ring shaped carrier including a layer of writing material, and a laser beam.

FIG. 8 is a perspective illustrating an additional method in accordance with the present invention. The method of FIG. 8 utilizes a carrier 30. Carrier 30 includes a generally tubular substrate 34 having an inner surface 104 defining a lumen 106. A writing material 36 overlays inner surface 104 of substrate 34.

As in the previous embodiments, generally tubular workpiece 22 is coupled to a workpiece motion control. In the present embodiment, workpiece motion control is adapted to rotate generally tubular workpiece 22 about an axis K. Carrier 30 is coupled to a carrier motion control which is adapted to rotate carrier 30 about an axis L. Workpiece motion control and carrier motion control may also be adapted to move workpiece 22 and carrier 30 longitudinally along axis K and axis L, respectively.

A laser beam 44 is positioned so that it illuminates a portion of carrier 30 proximate workpiece 22. When the laser source is activated, carrier 30 may be rotated to provide a constant supply of writing material 36. Workpiece 22 may also be rotated to make new portions of its lo surface available for deposition of writing material 36. The method illustrated in FIG. 8 may be utilized to form a variety of elements by depositing writing material 36 onto outer surface 52 of workpiece 22. Elements formed with this process may be functional or purely ornamental.

Figure 9:
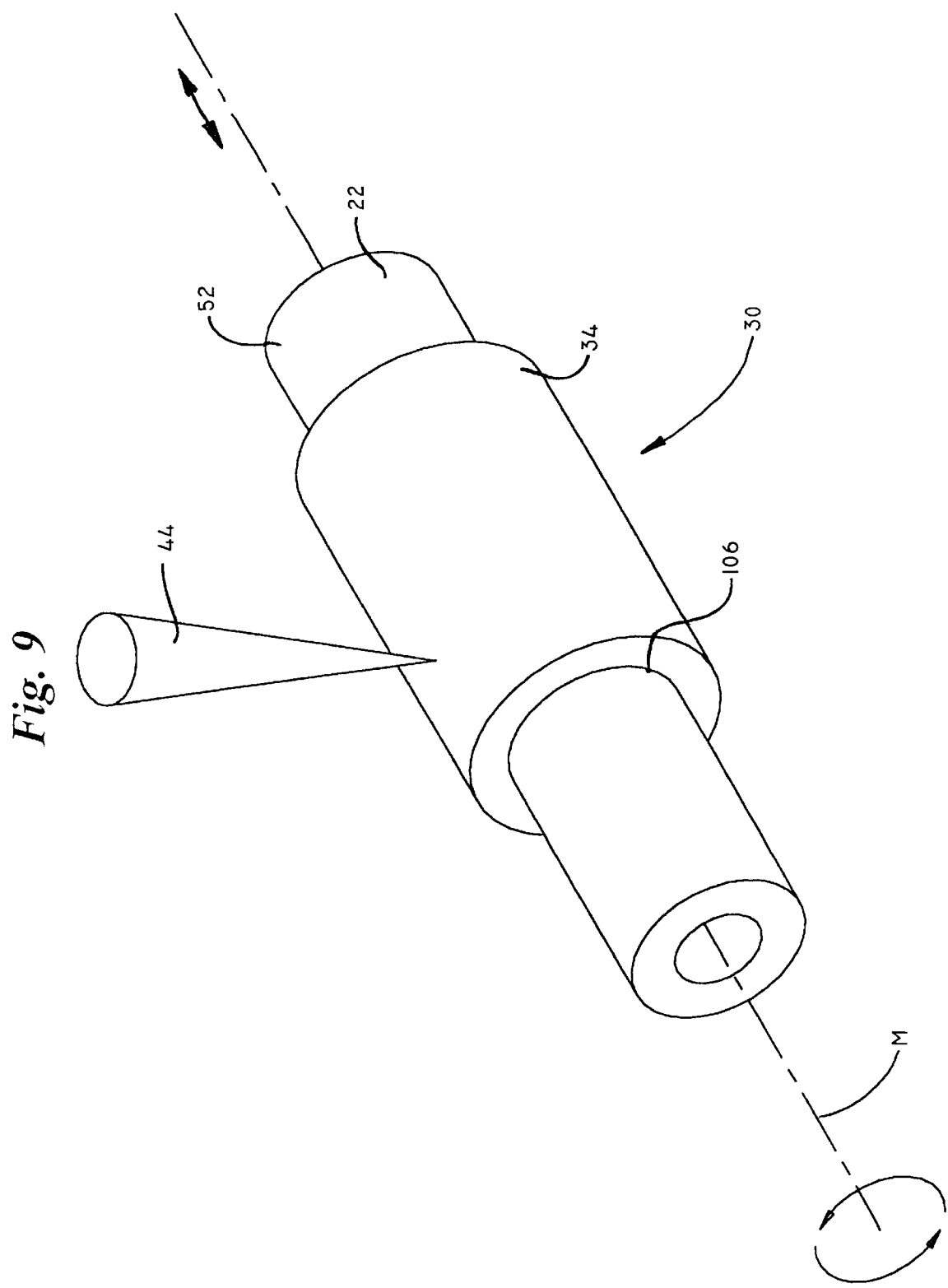
FIG. 9 is a perspective view of a generally tubular workpiece, a carrier which may include a seam, and a laser beam.

FIG. 9 is a perspective view illustrating an additional method in accordance with the present invention. The present method utilizes a carrier 30 including a generally tubular substrate 34 having an inner surface (not shown) defining a lumen 106. In FIG. 9, a generally tubular workpiece 22 is disposed within lumen 106 of carrier 30. As shown in FIG. 9, the outer diameter of generally tubular workpiece 22 is substantially equal to the diameter of lumen 106. A writing material overlays the inner surface of substrate 34. In a presently preferred embodiment, there is a slight friction fit between carrier 30 and generally tubular workpiece 22 such that the writing material is in intimate contact with outer surface 52 of generally tubular workpiece 22.

As in the previous embodiments, generally tubular workpiece 22 is coupled to a workpiece motion control. In the present embodiment, the workpiece motion control is adapted to rotate generally tubular workpiece 22 about an axis M. In a presently preferred embodiment, axis M overlays the longitudinal axis of generally tubular workpiece 22. Because there is a friction fit between generally tubular workpiece 22 and carrier 30, carrier 30 will rotate with generally tubular workpiece 22. The workpiece motion control may also be adapted to move workpiece 22 and carrier 30 longitudinally along axis M. A portion of the writing material may be deposited onto outer surface 52 of generally tubular workpiece 22 by selectively illuminating a portion of carrier 30 with a laser beam.

Figure 10:
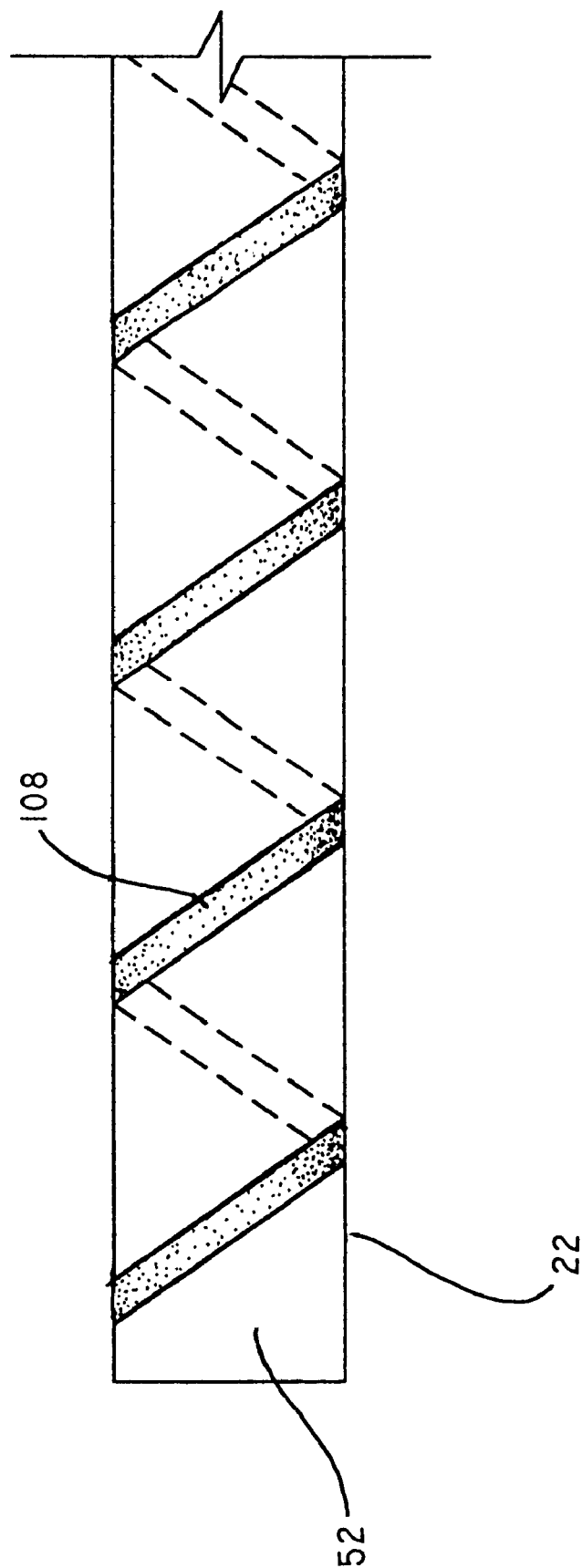
FIG. 10 is a plan view of a generally tubular workpiece having a conductor or structural component disposed on its outer surface.

FIG. 10 is a plan view of a generally tubular workpiece 22 having a conductor 108 disposed on an outer surface 52. In the embodiment of FIG. 10, generally tubular workpiece 22 may be comprised of a substantially flexible material. The generally helical path of conductor 108 makes it less likely that conductor 108 will crack when generally tubular workpiece 22 is flexed. Conductor 108 may be used to provide an electrical connection with a variety of elements. Examples of elements which may be coupled to conductor 108 include electrodes, pressure sensors, temperature sensors, flow sensors, and electromagnets.

Embodiments of conductor 108 have also been envisioned in which conductor 108 performs a desired function. Examples of functional conductors include antenna's and EMI shielding. Conductor 108 may be fabricated using a method in accordance with the present invention. Those of skill in the art will appreciate that more than one conductor may be deposited on a workpiece without deviating from the spirit and scope of the present invention. For example, two conductors may be deposited in the shape of a double helix. A portion of conductor 108 may be covered with a layer of insulating material. This insulating material may be fabricated using a method in accordance with the present invention.

Figure 11:
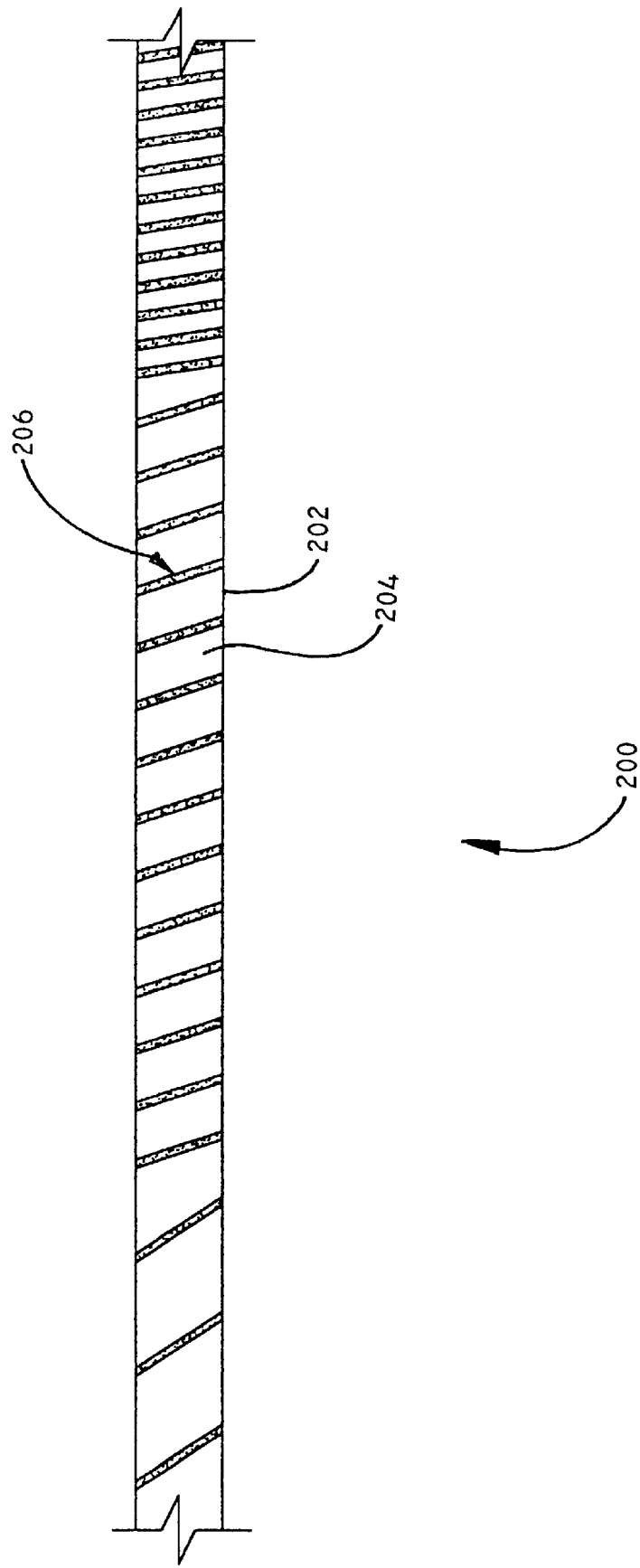
FIG. 11 is a plan view of a catheter in accordance with the present invention.

FIG. 11 is a plan view of a catheter 200 in accordance with the present invention. Catheter 200 includes a body 202 having an outer surface 204. A deposition 206 is disposed on outer surface 204 of body 202. In the embodiment of FIG. 11, deposition 206 has a generally helical shape with a variable longitudinal pitch. The pitch, and other factors, of deposition 206 may be varied to provide body 202 of catheter 200 with a stiffness which varies longitudinally along body 202.

Embodiments of catheter 200 have been envisioned in which body 202 of catheter 200 comprises a plurality of tubular members. When this is the case, deposition 206 could be placed at a transition point between two tubular members with different flexibility's to form a controlled strain relief based the thickness and orientation of deposition 206. Embodiments of catheter 200 have also been envisioned in which deposition 206 creates a device which is more flexible in one plane verses another plane.

Figure 12:
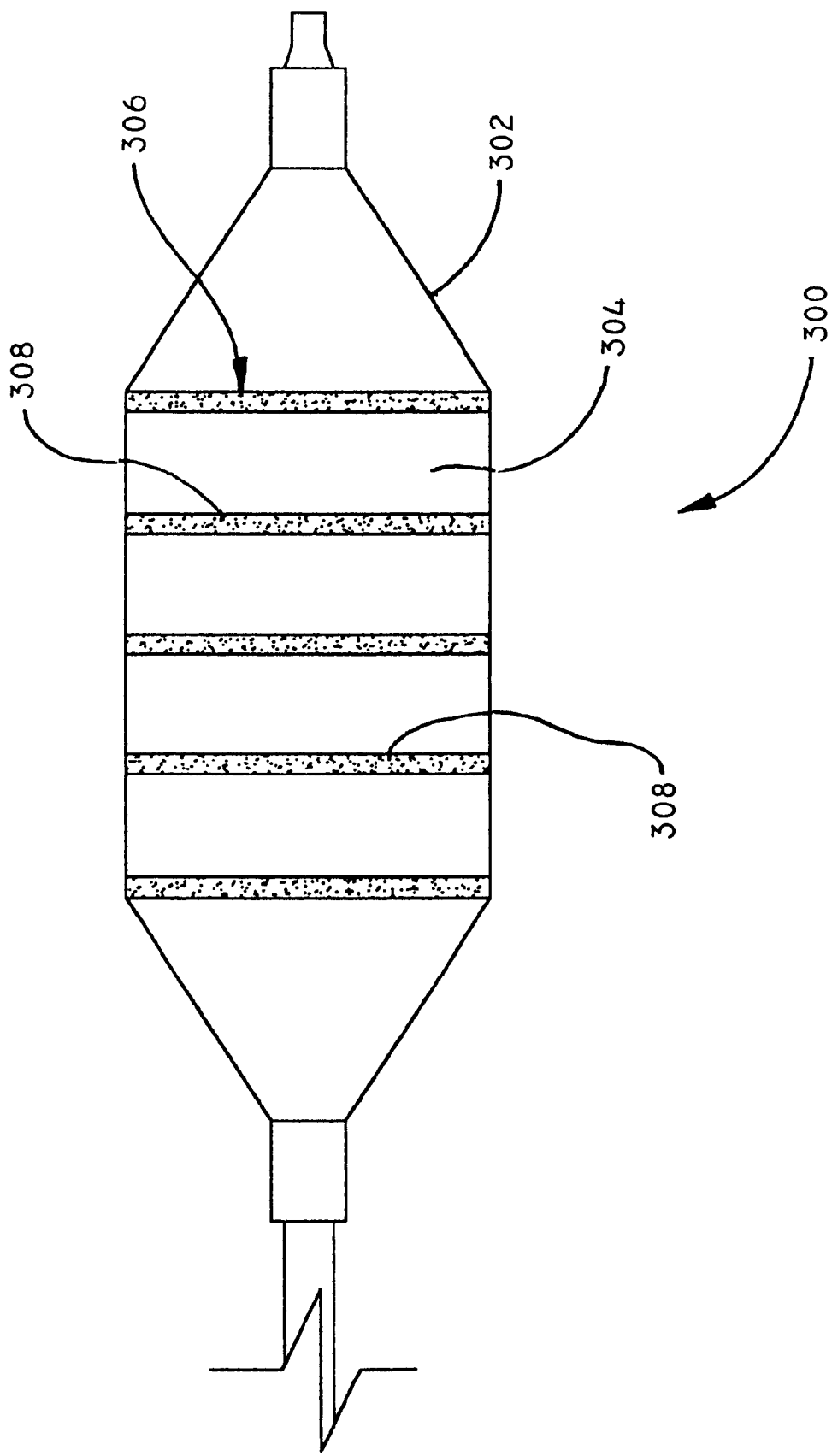
FIG. 12 is a plan view of a catheter having a balloon in accordance with the present invention.

FIG. 12 is a plan view of a catheter 300 including a balloon 302 having an outer surface 304. A deposition 306 is disposed on outer surface 304 of balloon 302. In the embodiment of FIG. 12, deposition 306 includes a plurality of rings 308. It is anticipated that the presence of rings 308 may reduce or eliminate the water- melon effect when inflating balloon 302 in a lesion.

Embodiments of catheter 300 have been envisioned in which deposition 306 comprises a spiral. Embodiments of catheter 300 have also been envisioned in which deposition 306 comprises a plurality of longitudinal stays. In these embodiments, it as anticipated that balloon 302 may form a plurality of lobes disposed between the stays when balloon 302 is inflated. It is also envisioned that the ends of the stays could be anchored proximate the ends of balloon 302.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The inventions's scope is, of course, defined in the language in which the appended claims are expressed.

What is claimed is:

1. An apparatus for applying a layer of writing material to a workpiece, said workpiece having an outer surface and a longitudinal axis, comprising a laser beam source capable of producing a laser beam;

a carrier comprising a substrate, and a layer of writing material overlaying the substrate;

a carrier motion actuator capable of moving the carrier relative to the laser beam;

a workpiece motion actuator capable of moving the workpiece rotationally about its longitudinal axis relative the laser beam;

a controller coupled to the carrier motion actuator, the workpiece motion actuator, and the laser beam source;

the carrier being interposed between the laser source and the workpiece; and the laser beam being adapted to illuminate a portion of the carrier.

2. A method of forming a layer of writing material on a surface of a workpiece, the method comprising the steps of:

providing a laser beam source capable of creating a laser beam;

providing a carrier comprising a substrate, and a layer of writing material overlaying the substrate;

coupling the carrier to a carrier motion actuator;

coupling the workpiece to a workpiece motion actuator;

positioning the carrier between the laser beam source and the workpiece;

illuminating a portion of the carrier with the laser beam;

moving the carrier relative to the laser beam; and moving the workpiece relative to the laser beam;

wherein the step of illuminating the portion of the carrier with the laser beam transfers a portion of the writing material to the workpiece;

wherein the step of moving the workpiece relative to the laser beam includes the step of rotating the workpiece about a first axis, said first axis being the longitudinal axis of the workpiece.

3. The method of claim 2, wherein the step of moving the workpiece relative to the laser beam further includes the step of moving the workpiece in a direction along its longitudinal axis.

4. The method of claim 2, wherein the step of moving the carrier relative to the laser beam includes the step of moving the carrier in a first generally linear direction.

5. The method of claim 2, wherein the step of moving the carrier relative to the laser beam includes the steps of moving the carrier in a first generally linear direction and moving the carrier in a second generally linear direction.

6. The method of claim 2, wherein the step of moving the carrier relative to the laser beam includes the steps of moving the carrier in a first generally linear direction and moving the carrier in a second generally linear direction, the second direction being about 90 degrees from the first direction.

7. A method of forming a layer of writing material on a surface of a workpiece, the method comprising the steps of:

providing a laser beam source capable of creating a laser beam;

providing a carrier comprising a substantially laser transparent substrate, and a layer of writing material overlaying the substantially laser transparent substrate;

coupling the carrier to a carrier motion actuator;

coupling the workpiece to a workpiece motion actuator;

positioning the carrier between the laser beam source and the workpiece;

illuminating a portion of the carrier with the laser beam;

moving the carrier relative to the laser beam; and moving the workpiece relative to the laser beam;

wherein the step of illuminating the portion of the carrier with the laser beam transfers a portion of the writing material to the workpiece;

wherein the step of moving the carrier relative to the laser beam includes the step of rotating the carrier about a first axis such that the carrier rotates about the workpiece.

8. The method of claim 7, wherein the step of moving the carrier relative to the laser beam includes the step of rotating the carrier about a second axis of rotation.

9. The method of claim 7, wherein the step of moving the workpiece relative to the laser beam further includes the step of moving the workpiece in a direction along its longitudinal axis.

* * * * *